United States Patent [19]  
Carver

[11] 3,989,897  
[45] Nov. 2, 1976

[54] METHOD AND APPARATUS FOR REDUCING NOISE CONTENT IN AUDIO SIGNALS
[76] Inventor: Robert W. Carver, 3520 NE. 135th, Seattle, Wash. 98115
[22] Filed: Oct. 25, 1974
[21] Appl. No.: 518,082

[52] U.S. Cl. .................................. 179/1 P; 325/65; 328/163; 333/17 R
[51] Int. Cl.² ......................................... H04B 15/00
[58] Field of Search .................... 179/1 P, 1 H, 1 D; 325/473, 65, 477, 480, 478; 328/163; 333/17 R; 84/DIG. 9

[56] References Cited
UNITED STATES PATENTS

| | | | |
|---|---|---|---|
| 3,180,936 | 4/1965 | Schroeder | 179/1 P |
| 3,403,224 | 9/1968 | Schroeder | 179/1 P |
| 3,747,703 | 7/1973 | Knowd et al. | 179/1 P |
| 3,803,357 | 4/1974 | Sacks | 179/1 P |

*Primary Examiner*—George G. Stellar  
*Attorney, Agent, or Firm*—Christensen, O'Connor, Garrison & Havelka

[57] ABSTRACT

Unwanted background noise in audio signals, and particularly in musical material, is significantly reduced by a multiple band dynamic filtering system operated in response to the fundamental and harmonic content and degree of correlation or nonrandomness of the audio signal. A plurality of voltage controlled band-pass gates or filters are established in the audio signal path for individually and selectively passing frequency content of the audio signal falling within each frequency band. The fundamental and harmonic content of the signal, typically a musical composition, is detected by a corresponding plurality of band-pass signal detectors, the outputs of which are connected to and for operating associated band-pass gates. Normally the band-pass gates are closed blocking any background noise present on the incoming signal. The band-pass detectors sense the presence of any fundamental or harmonic signal content and cause the appropriate band-pass gates to open and pass the full frequency content of the musical signal. The degree of correlation or nonrandomness of the audio signal is automatically monitored and the threshold detection of the presence of signal content in any one of the given frequency bands is varied in accordance with the degree of signal correlation.

8 Claims, 8 Drawing Figures

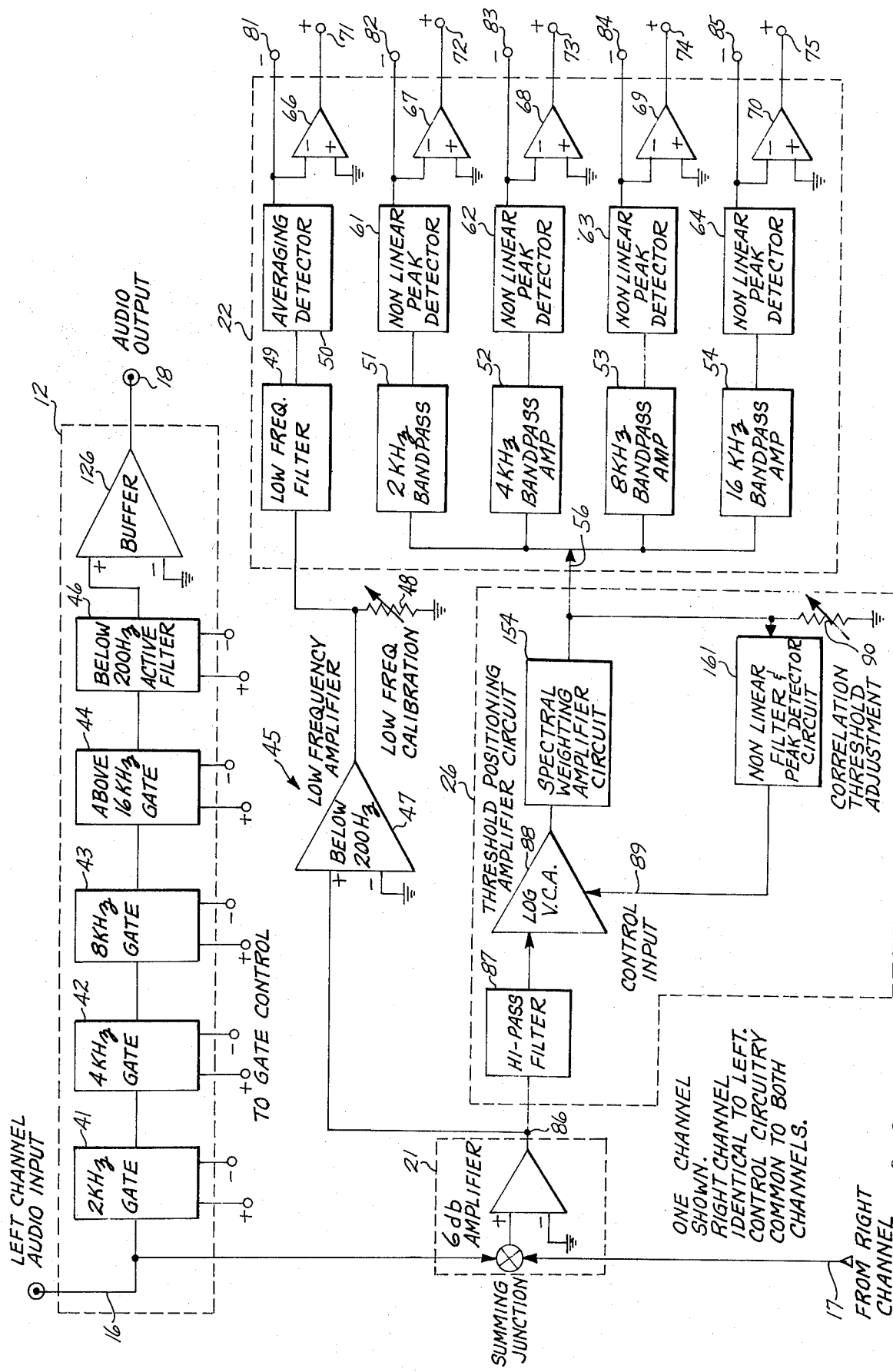

METHOD AND APPARATUS FOR REDUCING NOISE CONTENT IN AUDIO SIGNALS

BACKGROUND OF THE INVENTION

In general the present invention relates to noise reduction systems and more particularly to method and apparatus for removing background noise from audio signals, especially musical signals.

The presence of background noise, sometimes defined as wholly random signal energy, accompanying audio muscual signals has long been known as an undesirable but apparently unavoidable by-product of the transmission, recording and/or reproduction of audio signals. Many attempts have heretofore been made to reduce the noise content by various frequency filtering schemes. However, noise occurs at all frequencies within the audible band and as such any attempted filtering of the noise usually results in some loss of the musical frequencies.

For example frequency filters designed to remove the "scratch" noise during the reproduction from phonograph records constitutes a simple noise filter. The high frequency "scratch" sounds from the record are filtered out by cutting off the high frequency components of the reproduced signal. Inherently, the "scratch" filter removes the high frequency content of the record from the reproduced signal, diminishing the fidelity of the reproduction.

A more sophisticated filtering system employs what is known as dynamic filtering. Here the amount of rolloff or cutoff of the high frequencies is adjusted by a control voltage which is a function of the energy content of the reproduced or transmitted musical signal. These dynamic filters represent an improvement over the simple "scratch filter;" however, known dynamic filtering techniques only remove the higher frequency noise and cause a certain amount of undesirable modulation of the audible higher frequencies.

Another attempt at noise reduction has been the provision of multiple band dynamic filtering. This uses the dynamic filtering principle as discussed above together with a series or multiplicity of controllable band-pass filters. The individual filters are dynamically operated by the frequency content of the incoming signal. Thus during processing of the signal, the gates individually and collectively open and close allowing the musical content of the signal to pass through while blocking the noise content. Unfortunately, multiple band dynamic filtering systems heretofore developed have exhibited an objectionable audio "swish" sound coincident with each opening of one of the band-pass filters. The "swishing" sounds constitute a disturbing psychoacoustic effect and have prevented this type of filtering system from gaining wide acceptance in the high fidelity equipment industry.

Also, the "swish" sounds heard during the opening and closing of the band-pass filter gates demonstrates one of the inherent difficulties in reducing or eliminating noise from an otherwise high fidelity audio signal. The noise exists substantially continuously and uniformly within the band-pass of the musical material. The noise may be of greater or lesser magnitude relative to the strength of the audio information signal, however it is always superimposed thereon and as a practical matter inseparable therefrom.

Some systems have recognized the inseparability of the noise and information content of the signal and have merely provided a signal processing system for selectively increasing the amplitude of the musical material. However usually these systems require a preencoding of the musical signal such as by special encoding of frequency modulated signals, phonograph recorded signals and/or tape recorded signals. For example, one system widely used today for tape recording and reproducing systems provides for encoded recording of lower level musical passages at a higher amplitude, above the noise level or noise floor of the recording system. During playback the encoding/decoding process converts the playback signal back down to a correct amplitude for the lower level passages. This processing does provide a reduction of noise, however it can only be used in a "closed" system, i.e., where the source signal has been properly encoded.

SUMMARY OF THE PREFERRED EMBODIMENT AND ITS OBJECTS

Accordingly, it is an object of the present invention to provide a noise reduction system which preserves the entire frequency response of the incoming musical signal and does not introduce any objectionable psycho-acoustic effects during the signal processing.

Another object of the present invention is to provide a noise reduction system which operates in real time and does not require any preencoding of the signal. This processing is sometimes referred to as "open ended" processing in that an audio signal from any source may be passed through the system with the output thereof issuing a "clean" noise reduced signal in real time and without requiring redundant processing.

Briefly, these objects are achieved in accordance with the preferred embodiment of the invention by multiple band dynamic frequency filtering or gating that is controlled by the amplitude, harmonic content and degree of correlation (as the term is defined hereinbelow) of the audio/musical signal. A plurality of signal controlled band-pass filters or gates are adapted to receive and selectively pass frequencies of the music which fall within the respective frequency bands. A corresponding plurality of band-pass signal detectors are provided for sensing a threshold presence of signal content within each of the foregoing frequency bands. When any signal frequency content is detected, the corresponding band-pass filter or gate is opened to allow those frequencies to pass to the system's output.

In real time with the incoming signal, a circuit receives and monitors the content of the incoming audio signal and measures or estimates the degree of correlation of the content of such signal. As used herein, the term degree of correlation refers to the degree of periodicity, as contrasted with randomness, of the signal content. Those signals which exhibit a relatively high degree of periodicity are signals which are predictable and are thus considered to have a high degree of correlation. On the other hand signal content which is random, that is nonperiodic, is considered to have a relatively low degree of correlation. Pure sinusoidal musical sounds are highly correlated while noise is completely random and thus uncorrelated.

A circuit is provided for developing an electrical control signal which is a function of the degree of correlation of the incoming signal. This correlation function signal is combined with another signal representing the harmonic content of the incoming musical signal to control the threshold level at which the presence of musical information within each of the band-pass frequencies is detected. By automatically adjusting the various threshold levels at which the band-pass filter gates are opened it has been found that the incoming signal which is passed to the output is usually if not always of such amplitude, frequency and degree of correlation to subjectively "mask" the noise energy which inherently accompanies the musical information in each of the pass-bands.

These and further objects, features and advantages of the apparatus and method according to the present invention will become apparent to those skilled in the art from a consideration of the following detailed description of an exemplary embodiment thereof.

BRIEF DESCRIPTION OF THE DRAWINGS

FIG. 3 is a more detailed block diagram of a portion of the system shown in FIG. 1.

DESCRIPTION OF THE PREFERRED EMBODIMENT

Figure 1:
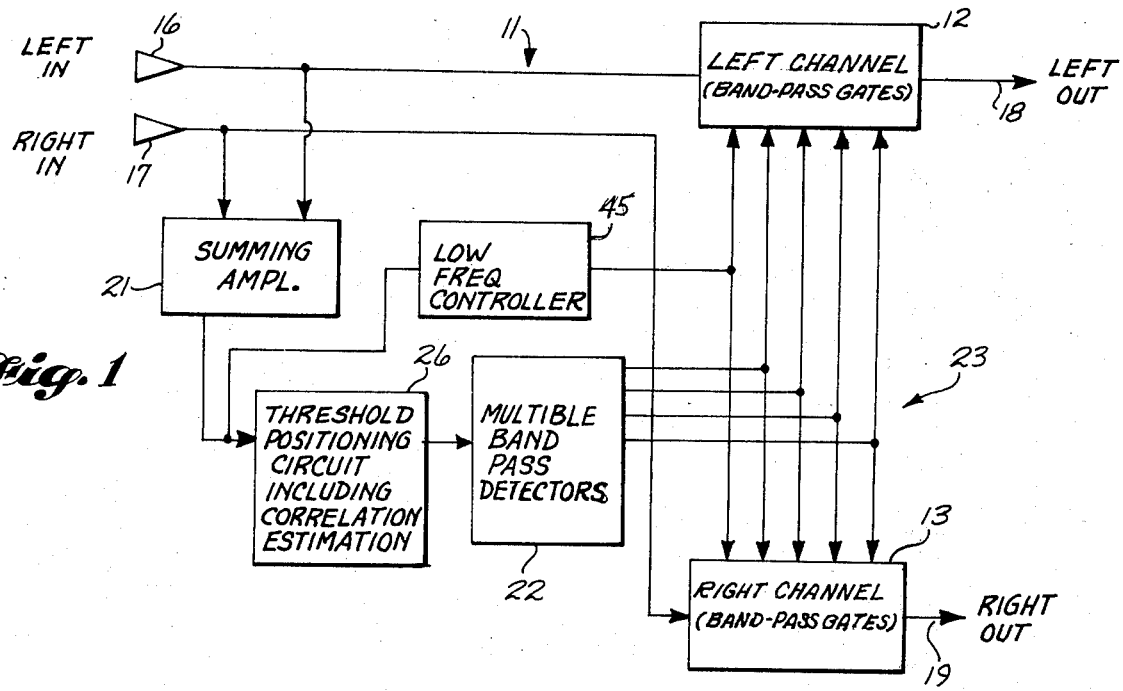
FIG. 1 is a generalized block diagram of the overall noise reduction system of the preferred embodiment of the invention.

With reference to FIG. 1, the present invention is embodied here in a noise reduction circuit or system for use in a stereo preamplifier or other stereo reproduction, transmission or recording system. Briefly the system includes a plurality of voltage controlled band-pass gates or filter means provided in each of left and right channels 12 and 13. The unprocessed musical signals are fed into the left and right channel inputs 16 and 17 and passed from there to the respective left and right channels 12 and 13 which are operated to selectively pass only certain frequency constituents of these signals to the left and right channel outputs 18 and 19. Although system 11 takes the form of a stereo, two-channel circuit, it will be apparent from the the following disclosure that the present invention may be embodied in a system having only a single musical channel or any number of additional channels.

For the present system 11, the signals from inputs 16 and 17 are summed in a summing amplifier 21 to develop a composite signal including the frequency constituents of both the left and right signal channels. This composite signal is then processed to develop a series of control signals for operating the left and right channels 12 and 13. In general the control signals are developed by a plurality of band-pass signal detecting means adapted to detect the threshold presence of frequency components of the incoming signal corresponding, respectively to the available band-pass frequencies provided by the band-pass gates in each of channels 12 and 13. In this instance the detecting means are provided by multiple band-pass detectors 22 having a plurality of outputs 23 connected to and for controlling the plurality of band-pass gates in each of channels 12 and 13. Briefly, detectors 22 will sense the presence of signal information within any one of the given frequency bands and operate the band-pass gates of left and right channels 12 and 13 to pass those frequencies. In the absence of signal information in any one or more of the given pass-bands, the associated band-pass gates of channels 12 and 13 remain closed, blocking the passage of background noise.

In order to insure the transmission of all signal information including the higher harmonics of signals with a relatively high degree of correlation and certain noiselike, musical sounds that exhibit a relatively low degree of correlation, means are provided for automatically varying the threshold level at which detectors 22 sense the presence of signal information. In this instance a threshold positioning circuit 26, including correlation estimation, is connected between summing amplifier 21 and multiple band-pass detectors 22. Circuit 26 automatically monitors the harmonic content and degree of correlation of the incoming audio signal and adjusts the threshold responsiveness of detectors 22 in accordance therewith. In general this circuit has the effect of conditioning the band-pass gate of channels 12 and 13 to pass lower amplitude high frequency harmonics, even when they are beneath the background moise level of the program, and to pass musical sounds of all frequencies that have a relatively low degree of correlation such as wire brushes, rushing water, etc. which are similar to random noise but are of course part of the information content of the signal.

In order to more fully understand the basic operating conditions of system 11, a discussion of the characteristics of noise and how it contaminates audio/musical information will be helpful. Noise content or noise energy in a signal is a completely random, noncoherent event. The noise energy exists substantially continuously and uniformly within the audible frequency band or more precisely within the band-pass of the system. Music and in general most information carrying signals will have an energy spectrum which is neither random nor continuous. That is, the music energy appears in discrete, predictable, energy bundles throughout the audio band and is therefore noncontinuous. Additionally, if some musical energy does appear, for example at a particular frequency, we also know that even and odd harmonics of the particular fundamental frequency will be present and moreover the location of such harmonics in the pass-band will be known. Furthermore, it is known that musical energy from the same source will not exist between these harmonics.

In other words, with information carrying signals and particularly music, it is possible to predict where the frequency content of the music is likely to occur, and if a fundamental frequency is present, the location of one or more harmonics thereof may also be established. Also, and importantly, it is possible to predict where the musical energy does not exist.

Because of the predictability of the frequency at which the musical energy appears, it is possible to selectively pass only those frequency constituents which make up the music content and block all other frequencies. Since noise appears in all of the available frequency bands, it will be appreciated that the closing or blocking of those frequency bands having an absence of musical energy results in a significant reduction in the noise content of the processed signal. For those frequency bands which are opened to allow passage of the musical content, any noise in such band-pass is also transmitted, however the music content is usually of sufficient amplitude to mask the associated noise.

System 11 operates to automatically and selectively open a plurality of pass-bands in the audio spectrum in response to the occurrence of musical frequencies or content within each such pass-band. Thus in effect, a series of frequency or band-pass windows are provided by the band-pass gates of channels 12 and 13, each window disposed side-by-side and slightly overlapping its neighbor, and together encompassing at least a portion of the audio band. Each band-pass window can be either opened or closed. In system 11, the various band-passes are normally closed and opened only in the event musical information appears having frequency content which requires any one or more of the given bands. For example in response to a musical signal having a lower frequency fundamental and one or more higher frequency harmonics, the band-pass windows provided by the gates of channels 12 and 13 associated with such fundamental and harmonic frequencies will be opened while all other frequency windows remain closed. As the frequency content of the musical composition changes from instant-to-instant the status of the band-pass gates changes to accommodate the new frequency constituents.

Figure 2:
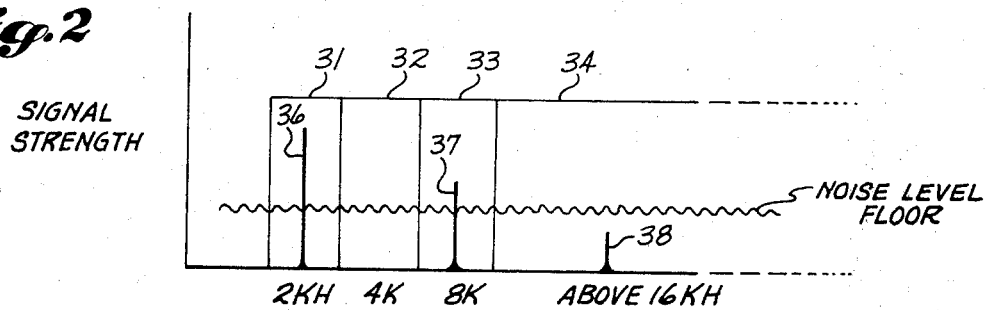
FIG. 2 is a signal strength versus frequency graph illustrating certain operating principles of the system shown in FIG. 1.

This operation is illustrated in a general manner in FIG. 2, wherein a series of band-pass windows 31, 32 33 and an upper frequency window 34 are provided. As illustrated in the figure, the presence of a musical energy component 36 at the 2 KHz frequency will cause the opening of band-pass window 31 of channels 12 and 13. Similarly the 8 KHz signal energy component 37, which may be a harmonic of the 2 KHz energy, causes band-pass window 33 to open. In this example there is an absence of signal energy in the 4 KHz band-pass and thus window 32 remains closed to block any random noise in this frequency band from reaching the system's output.

It is observed in FIG. 2 that a still further component 38 of signal energy exists in the higher frequency band-pass window 34. This higher frequency signal component may be a still further harmonic of energy components 36 and 37. It is also observed that energy component 38 has an amplitude which lies below the noise level or noise floor 39 of the system.

Usually the threshold levels of detectors 22 are adjusted so as to sense the presence of signal energy exceeding the noise floor of the system as is the case for energy components 36 and 37 of FIG. 2. In this manner the pure random noise of the system does not trigger the opening of the band-pass windows provided by the gates of channels 12 and 13.

However as described more fully herein it is a feature of the present embodiment of the invention that higher frequency harmonics such as energy component 38 lying below the noise floor are recovered. The recovery of the higher frequency low level harmonics preserves the overall frequency response of the system.

Another feature of this embodiment of the present invention is its ability to distinguish between highly uncorrelated music or other information sounds having a relatively low degree of correlation such as wire brushes, hand clapping, rushing water, and uncorrelated, completely random gaussean noise. Although it is desirable to remove as much of the random gaussean noise as possible, the system should not introduce any substantial attenuation of these and other musical or information sounds having a relatively low degree of correlation. For low level sounds of this type having an amplitude in the vicinity of the system's noise floor, the difficulty of distinguishing between the pure gaussean noise and the noise-like sounds is apparent. In general this distinction is successfully accomplished in the embodiment of the invention described herein by measuring or estimating the degree of correlation of the incoming signal and adjusting or varying the threshold responsiveness of detectors 22.

With reference to FIG. 3, these features are achieved in the present embodiment by threshold positioning circuit 26 including a correlation measurement or estimation means. This measures or estimates the degree of periodicity of the incoming signal energy. Circuit 26 among other things causes a change in the threshold level at which detectors 22 respond to the incoming signal frequencies as a function of the degree of correlation.

As indicated above, a signal that is "noise-like" is said have a relatively low degree of correlation. Examples of such sounds are sibilant speech, wire brushes on a drum head, hand clapping, waves crashing against a beach, the midpoint of a human cough, and the sound of rushing water. Some of these, such as the sound of wire brushes are found in musical material and constitute an important part of the musical content.

Gaussean noise also has a relatively low degree of correlation and, in fact, represents one extreme of the spectrum. Thus, completely random noise, or "hiss," to use the nomenclature of the high fidelity equipment field, is totally uncorrelated and may be assigned a degree of correlation of zero (0) representing one end of the spectrum.

On the other hand, a highly periodic signal such as a sine wave or "sine-wave-like" signal is considered to have a relatively high degree of correlation. Examples of such signals are the sound of a harp, a plucked guitar, a piano, certain vocal consonant sounds, etc. Because of this, a sine wave may be considered to be completely correlated and thus will be assigned a maximum degree of correlation of one (1). Since it is known from Fourier analysis that any periodic wave form is composed of a linear sum of one or more sine waves, correlation having a degree of one (1) applies in general to both a single sine wave and any linear sum of sine waves. The numerical values assigned to totally uncorrelated and totally correlated signals is arbitrary, however, it does facilitate an understanding of the principles upon which the present invention is based.

All sounds that occur in nature have a degree of correlation somewhere between zero (0) and one (1). Some sounds have values very close to zero, such as "hissing" air between your teeth. Other sounds have a degree of correlation whose value is very close to one (1) such as the pure ringing of a struck glass goblet or tuning fork. The degree of correlation of music, or in general, any information-containing signal, varies continuously from moment to moment. An interesting property of the degree of correlation is that its definition depends upon the history of the signal. This means that the value degree of correlation depends on its immediately preceeding history. Accordingly, it is necessary for circuit 26 to continuously monitor and estimate the correlation degree of of the incoming signal.

In FIG. 3, channel 12 is shown to be composed of a plurality of band-pass, voltage controlled filters or gates 41, 42, 43 and 44 serially connected to receive and selectively pass frequencies in the left hand audio channel. In addition to the band-pass gates 41–44 operated by detectors 22 in response to the threshold positioning circuit 26, an additional low band, voltage controlled dynamic filter 46 may be provided for filtering out low frequency "hum" and "rumble". Filter 46 is in this instance controlled by a separate low frequency controller 45 including low frequency amplifier 47 connected to the output of summing amplifier 21, a calibrating variable resistor 48 for adjusting the sensitivity of the low frequency filtering path, and a low frequency filter 49 and averaging detector 50 the output of which is connected to and for controlling filter 46. The presence of low frequency "hum" and "rumble" is amplified by low pass amplifier 47 and detected by filter 49 and detector 50 to close filter 46 whenever continuous low frequency energy above a desired "hum" and "rumble" level is sensed. This low frequency hum and rumble filtering is shown in combination with channel 12, detectors 22 and threshold positioning circuit 26, however, it constitutes a separate, independent circuit function which is preferably included in system 11 but may be omitted without affecting the threshold positioning and correlation estimating performed by circuit 26.

Multiple band-pass detectors 22 include a plurality of band-pass filters 51, 52, 53 and 54, each having a passband substantially coextensive with the pass-bands of signal gates 41–44. Thus, in this embodiment, band-pass filter 51 of detectors 22 has a center frequency of 2 KHz for controlling the operation of an associated 2 KHz gate 41 of channel 12. Similarly, band-pass filters 52–54, which may be in the form of band-pass amplifiers, are connected to and for controlling the associated signal gates 42–44. The inputs of filters 51 through 54 are jointly connected to an output 56 from the threshold positioning circuit 26 so that the summed incoming right and left hand channel signals are processed in circuit 26 and then applied to the set of band-pass filters 51–54.

Filters 51–54 serve as a means for breaking down the incoming signal into its frequency components, each component being located in one of the established pass-bands. This frequency breakdown constitutes a type of Fourier analysis where a given periodic wave form present at output 56 may generate responses at one or more outputs of gates or filters 51–54 depending upon its Fourier makeup.

Detector means are provided for sensing the threshold presence of signal energy in each of the pass-bands established by filters 51–54. In this embodiment, such means are provided by a plurality of nonlinear peak detectors 61, 62, 63 and 64. These detectors convert the alternating current energy received from the band-pass filters 51–54 into time varying direct current control voltages, the amplitudes of which are a function of the amount of signal energy in each of the pass-bands.

More particularly, detectors 61–64 sense a predetermined threshold of signal energy in each band-pass. If the signal strength in any given pass-band is less than the threshold responsiveness of its associated detectors 61–64, the output voltage from the detector maintains the corresponding signal gate 41–44 closed. A control voltage from any one or more of detectors 61–64 is available for opening the associated signal gates 41–44 only when band-pass filters 51–54 apply a sufficient threshold amount of signal energy to the inputs of the respective detectors to cause an opening of signal gates 44—44. Normally, the presence of pure random or gaussean noise at the inputs to band-pass filters 51–54 will be insufficient to reach the threshold level of responsiveness of detectors 61–64 and gates 41–44.

In this particular embodiment, each of the detectors 50, 61, 62, 63 and 64 has its output connected to one of polarity inverting amplifiers 66, 67, 68, 69 and 70 to produce a conjugate pair of control voltages for operating a particular type of diode control gate employed in band-pass gates 41–46 of channels 12 and 13. Thus, inverters 66 through 70 provide a plus polarity control voltage at output terminals 71, 72, 73, 74 and 75 while the uninverted outputs from the detectors provide the conjugate negative control voltage at terminals 81, 82, 83, 84 and 85.

In this particular and preferred embodiment, the threshold responsiveness of detectors 61 through 64 is varied through selective frequency amplification of the incoming signal by threshold positioning amplifier 26. In other words, the processed signal available at output 56 and applied to the inputs of band-pass filters 51 through 54 has been selectively amplified and/or attenuated as a function of its spectral content and degree of correlation so that detectors 61 through 64 will respond more readily, i.e., at a lower threshold, for those frequencies which have been differentially amplified by circuit 26 and will respond less readily, i.e., at a higher threshold, to those frequency components which have received less amplification or in some cases have been subjected to relative attenuation. Thus, the incoming audio information signal is processed by circuit 26 to form a signal having an amplitude versus frequency characteristic representing the parameters of harmonic content and degree of correlation. This signal, available at the output of circuit 26, is merely a control signal at this point and is not used in and of itself as any portion of the audio output signal. The actual signal channel proceeds exclusively in this case between inputs 16 and 17 and outputs 18 and 19, respectively, of channels 12 and 13.

An input 86 of threshold positioning circuit 26 receives the summed, amplified input signals from summing amplifier 21. In this instance, a linear, 6db amplification is provided by amplifier 21 between input 16 and 17 and input 86 to circuit 26. This summed and amplified control signal derived from the input channels is fed through a high-pass filter 87 which passes the higher signal frequencies associated with band-pass gates 41 through 44 and rejects the frequency components below these levels. It has been found that most of the random noise associated with reproduction, recording and transmission equipment for musical signals lies at frequencies of 1 or 2 KHz and above. Accordingly, the present embodiment of the invention provides for noise reduction at the 2 KHz level and higher. For this purpose, high-pass filter 87 is designed in this case to pass frequency components of 2 KHz or more.

The accentuated high frequencies are passed from filter 87 to a voltage controlled amplifier 88 having a control input 89 responsive to the harmonic content and degree of correlation of the incoming signal. More particularly a control signal is applied to input 89 of amplifier 88 so as to cause the gain of the amplifier to continuously vary and thus continuously change the threshold sensitivity of detectors 22 as the spectral distribution and degree of corrrelation of the incoming musical signal vary with time.

The functioning of circuit 26 is best understood by referring to several, general objectives sought from its operation. First, with reference to FIG. 2 it is desirable to set the threshold at which detectors 22 start to open band-pass gates 41–44 at a level just slightly above the noise level floor 39. By doing this, gates 41–44 are opened only as the leading edge, sometimes referred to as the "attack" of the music increases to a level just slightly above the noise level. Accordingly, when the gates begin to open, the noise tends to be masked by the increasing amplitude or strength of the musical signal and little or no noise modulation is perceived by the listener. This is to be contrasted with a situation in which the band-pass gate is opened immediately upon detecting any signal strength in any one of the band-pass frequencies. In such case there will be an objectionable "swish" sound as the noise itself is modulated by the opening of the band-pass gate. This is the first general rule of operation.

Secondly, this first general rule must be modified in certain instances to avoid the loss of certain high frequency components of the incoming signal. One such instance is in the case of low amplitude harmonics of a lower frequency fundamental. This situation is illustrated in FIG. 2 in which a higher frequency harmonic energy component 38 lies in amplitude below the noise level floor 39 while its associated lower frequency harmonics and fundamental lie above the noise floor. It is important in this type of situation to recover the higher frequency harmonics from beneath the noise floor. This desirable result is achieved in circuit 26 by sensing the existence of strong lower frequency fundamentals and tilting the frequency response at output 56 to push the threshold detection for these higher level harmonics below the noise floor. It has been found that there is very little psycho-acoustic perception of noise in this case, even though the threshold is positioned below the noise floor, so long as there are adjacent, higher amplitude lower frequency harmonics and fundamentals which are strong enough to mask the noise that is transmitted along with the weak harmonics.

Thirdly, for signals having a relatively low degree of correlation, for example signals having a correlation coefficient in the range of 0.1 to 0.3, it is desirable to push the threshold of response below the noise floor. This is true because musical sounds having a low degree of correlation, such as a wire brush, are very noise-like and the faithful reproduction of such sounds inherently requires the transmission of the pure random gaussean noise therewith. However, since the musical sounds again such as a wire brush are noise-like, these sounds substantially mask the underlying gaussean noise or pure "hiss" and there is no psycho-acoustic impression of increased noise content. For pure "hiss" in the absence of having a low degree of correlation musical or other information sounds, the threshold remains just slightly above the noise level in accordance with the first rule discussed above.

Now to achieve these operating results, circuit 26 includes various frequency responsive networks discussed herein, which provide the following frequency response at output 56. For pure random noise or "hiss" the frequency response of circuit 26 is substantially flat with a gain set so as to be just below the threshold of responsiveness of detectors 22. For information sounds which have a relatively high degree of correlation and include lower frequency fundamentals and higher frequency harmonics, the response of circuit 26 is to differentially increase the gain of the higher frequency components and slightly attenuate the lower frequency fundamentals and harmonics. This has a tilting effect on the frequency response curve of the circuit and causes the threshold level of the lower frequency components to be raised above the noise floor and the threshold responsiveness of the higher frequency harmonics to be pushed below the noise floor. This achieves the result desired under the second rule above whereby the higher frequency, lower amplitude harmonics are retrieved from beneath the noise floor of the system.

Circuit 26 also automatically and continuously monitors or estimates the degree of correlation of the incoming signal information. It this particular embodiment, the degree of correlation is indirectly estimated or sensed from the frequency makeup of the incoming signal. It has been found that the degree of correlation is roughly proportional to the instantaneous spectral energy distribution of the audio/musical material.

Figure 7:
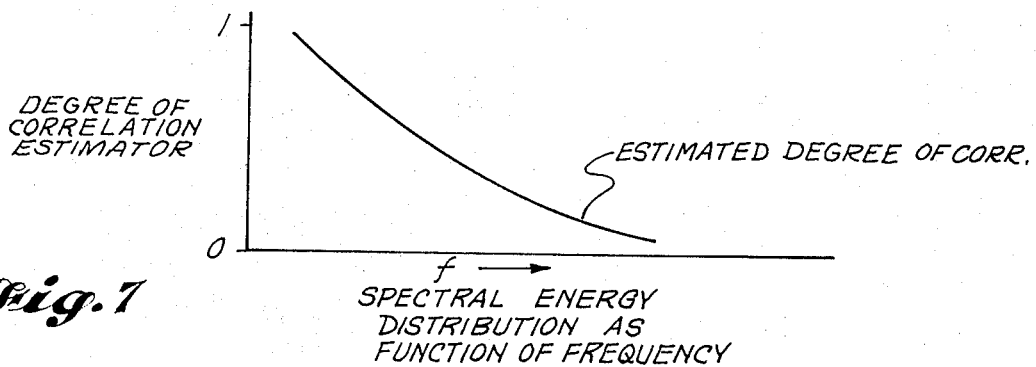
FIG. 7 is a graph illustrating how the degree of correlation can be estimated from the spectral energy distribution or content of the incoming signal.
Figure 8:
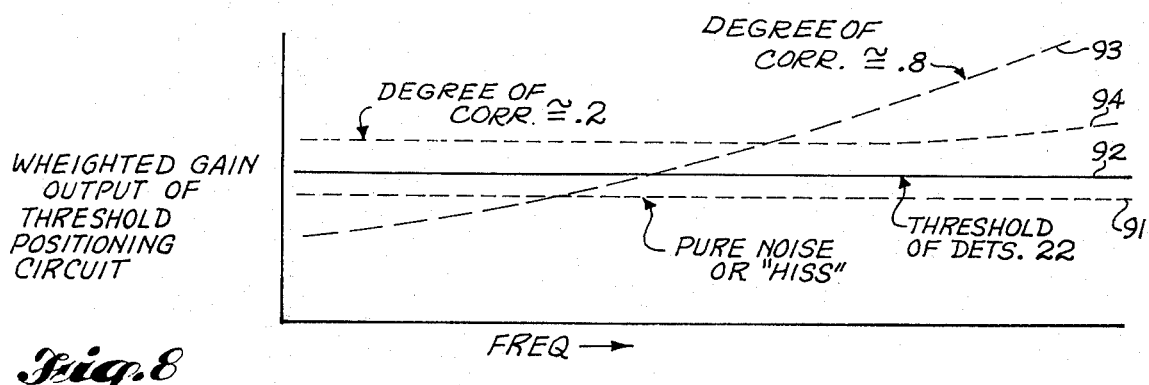
FIG. 8 is another graph showing how the threshold detection of the various frequency constituents of the incoming signal is varied as a function of both the degree of correlation and as a function of frequency.

This fact is illustrated in FIG. 7 which shows the degree of correlation varying as a function of the spectral energy distribution of the input signals. For incoming signals having the larger portion of their energy distributed in the relatively lower frequencies, for example in this instance in the band-pass frequencies of 2 and 4 KHz, the degree of correlation is usually closer to 1. On the other hand where the energy is concentrated nearer the higher end of the frequency bands, the degree of correlation drops toward zero. Circuit 26 monitors this spectral energy distribution and produces a control signal applied at input 89 of amplifier 88 for adjusting the amplifier's gain as a function of the degree of correlation. This is best illustrated in FIG. 8 which shows the frequency response or weighted gain of the output of threshold positioning circuit 26 for incoming information signals having a degree of correlation of 0.2 and 0.8 and also shows the response of circuit 26 in the absence of any information content in the incoming signal.

Accordingly, for pure "hiss" or noise, absent any information content, the frequency response and gain of circuit 26 is indicated by dotted line 91 and shows the response to be substantially flat throughout the frequency spectrum and with the gain positioned just slightly under the threshold of detectors 22 as represented by solid line 92. The background noise content of the incoming signal is evenly amplified by circuit 26 but with insufficient gain to cause detectors 22 to open any of the band-pass gates 41–44.

Now assume that information content appears on the incoming signal and is sufficiently correlated to exhibit a degree of correlation of 0.8. This indicates a relatively highly correlated information content with the signal energy being concentrated in the relatively lower fundamental frequencies but with the possibility of lower level higher frequency harmonics existing beneath the noise floor. Accordingly, as illustrated by dotted line 93 in FIG. 8, circuit 26 tilts the frequency response between its input 86 and output 56 so as to slightly attenuate the lower frequency components and accentuate the higher frequencies. This requires the lower frequency fundamentals and harmonics to achieve an amplitude above the threshold indicated at 92 in order to cause detectors 22 to open the gates 41–44, i.e., presenting a higher threshold to the relatively lower frequencies, and increasing the gain of the higher frequency harmonics to provide a lower threshold of sensitivity thereto.

Now assume that the information content of the incoming signal becomes more random and exhibits a lower degree of correlation of 0.2. In this case, as exemplified by dotted line 94 in FIG. 8, the frequency response of circuit 94 remains relatively flat throughout the audio spectrum and the gain is increased so as to present a lower threshold of responsiveness of detectors 22. This corresponds to the situation in which information sounds of a relatively low degree of correlation, such as wire brushes rubbing on a drum head, rushing water, hand clapping, require a reduction of the detector's threshold to a level below the noise floor in order to faithfully reproduce the signal information. It is observed again however that there is no loss of the overall psycho-acoustic perception of noise reduction in this latter instance because the noise-like information, sounds substantially, if not totally, like the underlying pure noise or "hiss."

Figure 4:
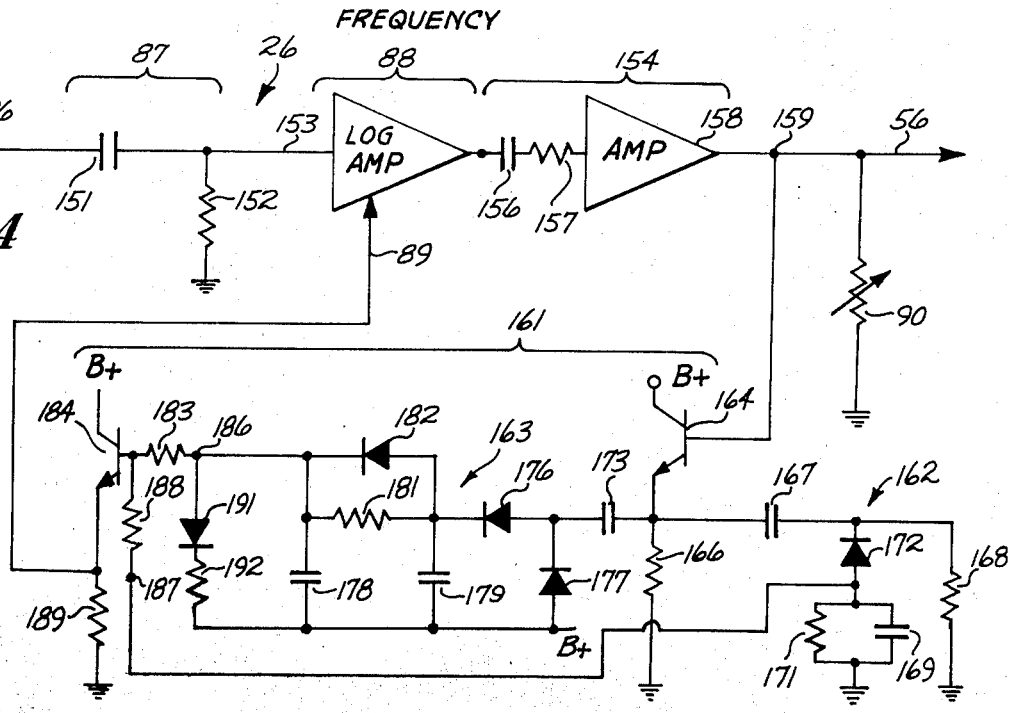
FIG. 4 is a detailed schematic of the threshold positioning amplifier circuit shown diagrammatically in FIGS. 1 and 3.

Although a number of circuit configurations may be used to provide the foregoing operating characteristics for circuit 26, a preferred and relatively inexpensive form of this circuit is illustrated in FIG. 4 and includes high-pass filter 87 which may be provided by a capacitor 151 and resistor 152 for differentially weighting the frequency response of the circuit in favor of the higher frequencies. Voltage controlled amplifier 88 is in this instance a log amplifier in which the output voltage therefrom tracks the logarithm of the input voltage. This nonlinear amplification performed by log amplifier 88 serves to consolidate or reduce the overall dynamic amplitude range of the incoming signals to a level suitable for serving as a control signal at the output 56 of circuit 26. Although the amplifier does introduce a log relationship between the output and input, the amplifier gain is also varied as a function of control input 89 which is a linear control function. In other words, for a constant input voltage to amplifier 88 at input 153, the output of the amplifier will vary by an amount directly proportional to the change in the control voltage applied at control input 89.

From the output of voltage controlled log amplifier 88, the control signal is fed to a spectral weighting amplifier circuit 154 for further accentuating the high frequency response relative to the lower frequency response. For this purpose, circuit 154 includes a serially connected RC network including capacitor 156 and resistor 157 and an amplifier 158. Accordingly, the signal as processed by filter 87, amplifier 88 and spectral weighting amplifier circuit 154 results in a signal at junction 159 varying as the logarithm of the signal applied at input 86 and weighted in favor of the higher frequency component.

This signal available at junction 159 is fed back to and for controlling the gain of amplifier 88 through a nonlinear filter and peak detector circuit 161 operating to vary the gain of circuit 26 as a function of the relative degree of correlation of the incoming signal and to tilt the frequency response of the circuit during the presence of highly correlated, relatively low frequency fundamental and harmonic signals for the purposes described more fully above. In particular, circuit 161 as shown in FIG. 4 includes a relatively high frequency filter and peak detector network 162 and a relatively low frequency filter and peak detector network 163 wherein both of these networks are responsive to the feedback signal from junction 159 through a transistor 164 connected with resistor 166 in an emitter-follower configuration.

The relatively frequency filter and detector network 162 includes filter components formed by serially connected capacitor 167 and resistor 168 and parallel-connected capacitor 169 and resistor 171. A peak detection diode 172 is connected between the RC network formed by capacitor 167 and resistor 168 and the RC network formed by capacitor 169 and resistor 171 to detect the energy content in the relatively higher frequencies of the signal passing through circuit 26 as modified by filter 87, amplifier 88 and amplifier 154.

Similarly, relatively low frequency filter and detector network 163 includes a blocking capacitor 173, peak detection diodes 176 and 177, capacitors 178 and 179, a resistor 181 and a diode 182 which is connected across the filter network composed of resistor 181 and capacitors 178 and 179 to form a nonlinear filter responsive to the peak detection of diodes 176 and 177. While network 162 detects the relatively high frequency energy content of the signal, network 163 detects the energy content carried by the relatively lower frequency constituents of the incoming signal. The networks 162 and 163 produce control signals that vary in opposite polarity senses, wherein the control signals are summed at a summing junction formed at the connection of resistor 183 to the base of transistor 184.

More particularly, the output of the relatively low frequency nonlinear detection network 163 is presented at a junction 186 and summed with the output of the relatively higher frequency detection network 162 available at output junction 187 by means of resistors 183 and 188 with the signals thus summed being fed to and for controlling input 89 of log amplifier 88 through the emitter-follower formed by transistor 184 and resistor 189.

When the lower frequency energy predominates in the incoming signal received by circuit 26, network 163 detects this condition and produces a positive signal change at junction 186 that increases the voltage thereat in a positive sense for summing with the signal from network 162. On the other hand, in the event the signal received by circuit 26 is loaded with high frequency energy, the network 162 detects this condition and produces a negative signal change at the junction between diode 172 and the resistor and capacitor 171 and 169 respectively, that decreases the voltage thereat in a negative sense and where this negative sense signal is extended to junction 187 for summing with the output from relatively low frequency nonlinear detector 163. When the net voltage applied to the base of transistor 184 through summing resistors 183 and 188 increases in a positive sense, this causes a control voltage on input 89 which decreases the gain of log amplifier 88. On the other hand, a negative voltage change applied to the base of transistor 184 produces an increase in gain of amplifier 88. When the high and low frequency energy content is fairly uniformly distributed, then there is no net positive or negative signal variation applied to transistor 184 and the gain of amplifier 88 remains at a uniform medium level.

As a practical matter, the relatively low frequency responsive detector and filter network 163 is also responsive to higher frequency energy content along with the lower frequency energy. For this purpose a clamping diode 191 and resistor 192 are connected across the output of junction 186 from network 163 so as to limit the maximum positive excursion of the output voltage at junction 186 so that in response to predominant high frequency signal energy content and network 162 produces a negative voltage change which prevails at the summing junction of resistors 183 and 188 for increasing the gain of amplifier 88.

For signal information of relatively low degree correlation received by circuit 26, which condition is sensed by a predominant abundance of high frequency energy content as detected by network 162, the overall gain of circuit 26 increases to cause a commensurate reduction in the threshold detection level as is desired in accordance with the above noted operating principles. Similarly, when the signal energy is predominantly of a low frequency, network 163 senses this condition and reduces the gain of amplifier 88 for tilting the frequency response of circuit 26 accentuating the higher frequency, lower level harmonics and attenuating the larger amplitude, lower frequency fundamentals and harmonics. This has the net affect of decreasing or reducing the threshold of the higher frequency harmonics to retrieve them from beneath the noise floor of the system while insuring that the lower frequency fundamentals and harmonics are of sufficient amplitude to mask any higher frequency "hiss" or pure gaussean noise passed by the system.

Figure 5:
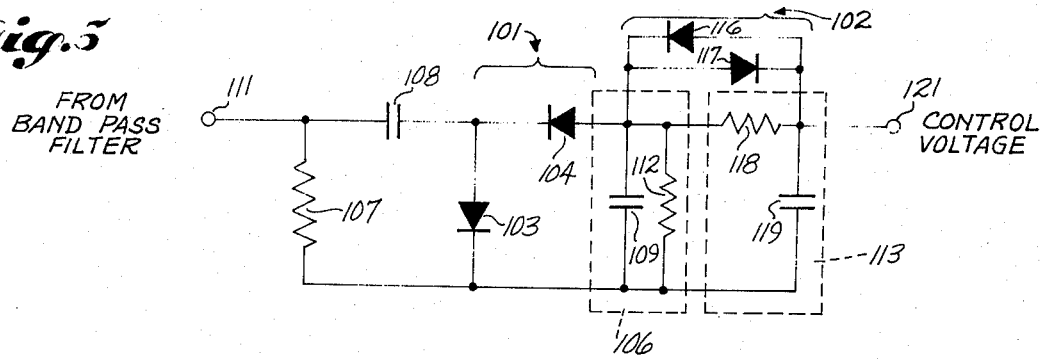
FIG. 5 is a detailed schematic of one of the non-linear peak detectors shown diagrammatically in FIG. 3.

With reference to FIG. 5, each of the nonlinear peak detectors 61–64 may be provided by the combination of a half-wave voltage doubling peak detector 101 and a nonlinear transfer network 102. Half-wave voltage doubling peak detector 101, in this instance, includes diodes 103 and 104 and a parallel capacitive-resistive network 106 connected between the anode and cathode of the diodes as shown. An input network including resistor 107 and a capacitor 108 receives the signal energy from an associated one of band-pass filters 51–54 and applies the representative voltage therefrom across network 106. Diodes 103 and 104 allow capacitor 109 of network 106 to charge up to a level proportional to the peak magnitude of the signal applied at input terminal 111 and thereafter assume a high impedance condition which causes capacitor 109 to discharge, if at all, through its associated parallel resistor 112 of network 106. Thus, capacitor 109 is rapidly charged to a peak value function by diodes 103 and 104 and thereafter is discharged in accordance with the time constant formed by the values of capacitor 109 and resistor 112 of network 106.

The time constant of network 106 is selected to be relatively fast, e.g., less than 1 millisecond in order to permit rapid, faithful tracking of the band-pass signal information applied to the detector. This results in a dynamic response for each of detectors 61 through 64 which will follow rapidly the "attack" and "decay" of musical signals without undesirable overshoot. However, it has been found that such a rapid response of the detector sometimes causes intermodulation distortion between the information signal passing through each of the correlators and the control signal generated by circuits 26 and detectors 22.

Accordingly, in this preferred embodiment of the present invention, each of detectors 61–64 is provided with a nonlinear transfer network 102 which has been found to permit both the rapid tracking of peak detector 101 and yet eliminate most, if not all, intermodulation distortion otherwise originating from this circuit.

In general this is achieved by network 102 which includes a slower time constant resistive-capacitive network 113 and a pair of back-to-back transfer diodes 116 and 117 connecting networks 106 and 113. Usually intermodulation distortion is caused by relatively low frequency amplitude variations in an otherwise continuous signal. In order to eliminate these from the response of the detectors, transfer network 102 is relatively unresponsive to slowly varying amplitudes in which the amplitude deviation is relatively small and quite responsive to rapidly varying amplitudes where the amplitude change is significant. For this purpose network 113 includes a resistor 118 and a capacitor 119 selected to have a relatively large time constant with respect to network 106. For example a time constant equal to or greater than 1 second has been found adequate. Transfer diodes 116 and 117 create an amplitude window equal to the sum of the forward voltage drop for each diode in which an output 121 of the circuit does not track the low frequency amplitude variations of the incoming signal. For significant amplitude variations at input 111, the forward voltage drop of the diodes 116 and 117 is substantially exceeded and output 121 directly tracks the peak variations of circuit 106 through the transfer diodes. As indicated above, this nonlinear detection is necessary to prevent the control voltage developed at the output of detectors 22 from modulating the envelope of the audio signals passing through channels 12 and 13 which would be a form of intermodulation program distortion. The control voltage available at output 121 is used to develop the conjugate pair of control voltages at the outputs of each of detectors 61–64 by connecting the various polarity inverters 67–70 to form outputs 72–75 and feeding the uninverted control voltage directly to outputs 82–85 to form the other control voltage polarity of the conjugate pair.

Figure 6:
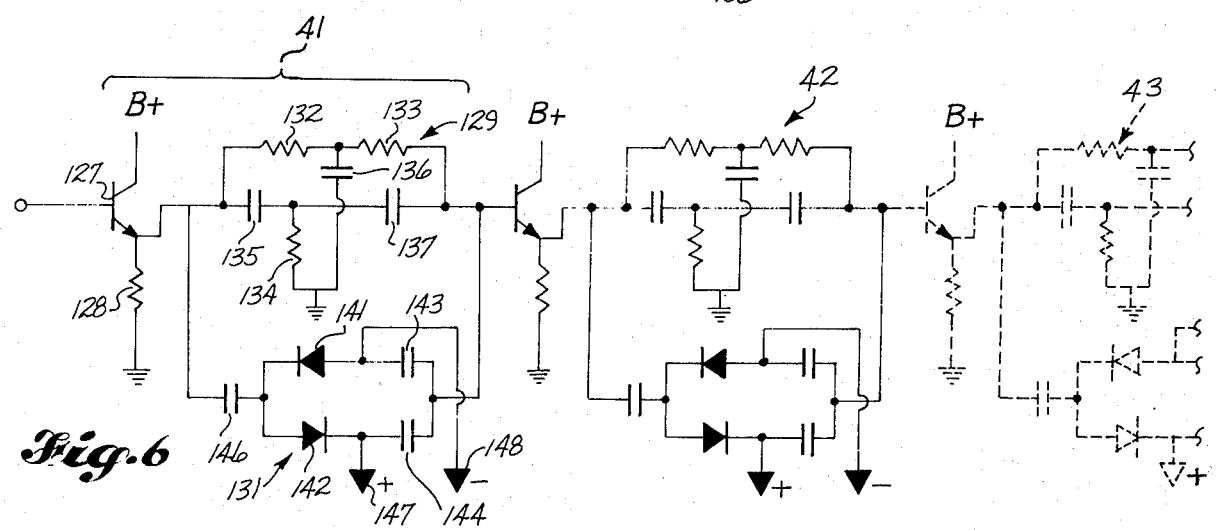
FIG. 6 is a detailed schematic diagram of the first several band-pass gates shown diagrammatically in FIG. 3.

With reference to FIG. 6, voltage controlled band-pass filters or gates 41–44 are in this instance provided by a cascaded series of voltage controlled notch filters covering the relatively higher frequency audio bands from 2 KHz to 20 KHz, each filter slightly overlapping its nearest neighbor. Band-pass gate 41 is illustrated in detail in FIG. 6 with the succeeding band-pass gates being of substantially identical construction, with merely different component values to achieve the different band-pass frequencies. At the trailing end of this cascaded series of band-pass filters or gates 41–44, a conventional low frequency dynamic filter 46 is connected as shown in FIG. 3 to complete the serial filtering, and a buffer amplifier 126 may be employed to pass the audio signal from the last filter of the chain to audio output 18.

With particular reference to band-pass gate 41 as shown in FIG. 6, each voltage controlled filter or gate is provided at its input with an impedance matching emitter/follower, here provided by transistor 127 and resistor 128. The band-pass itself is provided by a relatively sharply tuned, three pole feed-back notch filter network 129 which may be selectively bypassed by a voltage controlled diode network 131 which is connected to the output of an associated nonlinear peak detector, in this instance detector 61 of detectors 22.

In the absence of a control voltage applied to network 131, the audio signal proceeds through each notch filter such as filter 129 and those frequency components within the band established by the filter are essentially shorted out to ground and thus removed from the signal spectrum. Alternatively gates 41–44 and their associated notch filters, such as notch filter 129 may be thought of as a sequence of side-by-side frequency windows covering the audio spectrum from 2 KHz through 20 KHz and above, wherein each of these windows may be selectively opened and closed depending upon the frequency makeup of the incoming signal. The lower frequency active or dynamic filter 46 is independently responsive to the low frequency controller 45 as discussed above.

The frequency band over which each of the notch filters is effective can be established and changed by selecting the resistive and capacitive components such as resistors 132, 133 and 134 and capacitors 135, 136, and 137 in a well known manner. Diode switching network 131 includes back-to-front parallel diodes 141 and 142 and blocking capacitors 143, 144 and 146 and is connected in shunt around notch filter 129 as illustrated. Normally network 131 assumes a high impedance condition placing notch filter 129 in the circuit and effecting removal of the particular frequency components associated with that filter. This corresponds to a condition in which the filter gate is closed.

In order to open the gate, network 131 is driven by balanced control inputs 147 and 148 to a lower impedance condition shunting notch filter network 129. More particularly this is achieved by connecting inputs 147 and 148 to the associated conjugate pair of control outputs from detectors 22, namely in this instance to output terminals 72 and 82 from nonlinear peak detector 61. The presence of a threshold control voltage at the output of the associated detector causes the diodes of network of 131 to become forward biased and assume the necessary low impedance condition for bypassing the notch filter. Although a single voltage control diode may be used in network 131, here the front-to-back parallel diodes 141 and 142 controlled by the conjugate pair of output voltages from the detectors 22 causes a cancellation of the residual positive and negative control voltages applied to circuit 131. This cancellation afforded by the two-diode balanced switching network avoids the injection of any extraneous control signals into the information signal path.

The aforementioned threshold responsiveness of detectors 61–64 in conjunction with gates 41–44 is established in this embodiment by the overall gain of the various circuits between output 56 of circuit 26 and the incipient bypassing of the various notch filters forming gates 41–44. The system may be set up and properly adjusted by varying the correlation threshold adjustment provided by variable resistor 90 of threshold positioning amplifier circuit 26 as shown in FIGS. 3 and 4. In general the correlation threshold adjustment provided by variable resistance 90 is adjusted to a center position and a relatively clean high quality modern phonograph record is played through the system. Preferably the record should have a musical selection which contains an abundance of high frequencies. By carefully listening to the playback of the record, and simultaneously adjusting correlation threshold resistor 90, a setting may be reached in which the high frequency treble is faithfully reproduced and yet the underlying random noise disappears. To one side of the proper setting, too high a threshold will be presented to the incoming signals and unacceptable loss of high frequency response will occur. On the other hand, a setting too far in the other direction will result in too low a threshold and all of the random noise present in the reproduction system will be passed to the output of channels 12 and 13.

In the foregoing manner it will be appreciated that this embodiment of the present invention provides a method of suppressing background noise and particularly purely random noise which has contaminated an audio/musical signal. This is accomplished even though in some cases the signal may include information content having both relatively high and low degrees of correlation i.e., noise-like, information content together with the wholly uncorrelated, noise content such as "hiss".

As a first step in this process, the threshold presence of the incoming signal is detected in each of a plurality of frequency bands where the selection and number of bands may be at the option of the designer. Simultaneously with the threshold presence detection, the incoming signal is monitored for its degree of correlation. The more highly correlated signals are those exhibiting the greatest periodicity such as a sine wave or a waveform composed of the sum of many sine waves according to Fourier's theorem.

The threshold at which signal energy is detected in each of the established bands is thereupon varied as a function of the degree of correlation of the audio/musical signal. For signals having a high degree of correlation the threshold is generally increased, except in the case of higher frequency lower level harmonics for which the threshold is decreased, while for relatively low degree correlated, noise-like sounds the threshold is decreased across the entire spectrum.

The complex detection of signal energy presence is thereupon used to selectively pass those frequency components of the processed audio signal falling into the frequency bands in which such energy was detected over the variable threshold.

The resulting psycho-acoustic effect of this signal processing is to present a substantially noise-free audio/musical signal which preserves the full frequency spectrum of the original program. In those cases where the threshold detection of the noise contaminated incoming signal has been lowered so as to simultaneously allow the passage of pure "hiss" or gaussean noise to the system's output, the information content of the signal either has a relatively low degree of correlation and is thus noise-like, such as in the case of wire brush sounds, rushing water sounds, etc., or musical material predominated by high energy lower frequency fundamentals and the associated higher frequency harmonics. In either of these instances in which the threshold is pushed below the noise floor of the system, the information content has either a sufficient amplitude or is sufficiently noise-like even though at a lower amplitude, to substantially if not entirely mask the pure gaussean noise or "hiss."

While only one particular embodiment of the present invention has been disclosed herein, it will be readily apparent to persons skilled in the art that numerous changes and modifications may be made thereto without departing from the spirit of the invention. For example, in the disclosed system and method, the plurality of voltage controlled pass-band filters forming channels 12 and 13 have been provided by a limited number of band-pass gates, here having a one octave relationship. In the alternative any number of gates may be employed in lieu of the one octave gates 41 through 44 and covering a broader or narrower frequency spectrum within the audio band. The greater number of gates will result in a further reduction in the background noise at the system's output.

Similarly, the system's performance may be enhanced by providing separate control circuits, namely separate threshold positioning amplifier circuits and detection circuits such as circuit 26 and detectors 22 for each of the two or more audio channels of the system. In this embodiment the two stereo channels have been summed by amplifier 21 to generate a single set of control signals which are jointly applied as shown in FIG. 1 to channels 12 and 13. In an alternative system, even the control channels would be maintained separate from one another, by merely duplicating the control channel including circuit 26 and detectors 22 for each of the right and left hand audio channels.

Accordingly, the foregoing disclosure and description of the preferred embodiment of the invention is for illustrative purposes only and does not in any way limit the invention which is defined only by the following claims.

I claim:

1. A method of suppressing background noise in an audio frequency signal comprising the steps of:
    producing an electrical control signal derived from said audio signal in which the frequency components of said control signal are continuously varied relative to the amplitudes of the corresponding frequency components of said audio signal as a function of the instantaneous amplitude verses frequency content of said audio signal;
    detecting a threshold presence of said frequency components of said control signal in each of a plurality of frequency bands; and
    selectively passing frequency components of said audio signal falling within each of said plurality of frequency bands only when a threshold presence of said frequency components of said control signal have been detected within the corresponding frequency band.

2. A noise reduction system for an audio signal comprising:
    a plurality of electrically-controlled filter means, each having a defined frequency band, for receiving said audio signal and for selectively passing frequency components thereof that fall within each of said bands;
    a threshold positioning circuit means having an input for receiving said audio signal and for modifying it to produce a control signal at an output, said control signal including frequency components of said audio signal in which the amplitudes of such components are continuously varied, relative to the amplitudes of the corresponding frequency components of said audio signal, such continuous variation being a function of the amplitude versus frequency content of said audio signal; and
    a plurality of band-pass threshold signal detecting means, one being associated with and connected to each of said filter means, each said detecting means having a pass-band corresponding to said frequency band of the associated said filter means, each said signal detecting means connected to said threshold positioning circuit means for receiving said control signal and being responsive to frequency components falling within its pass-band, said filter means being operated by its associated said detecting means to pass said frequency components when the latter detects that the level of said frequency components of said control signal have exceeded a predetermined threshold.

3. The noise reduction system of claim 2, wherein said threshold positioning circuit means comprises:
    high pass frequency filter means connected to said input of said threshold positioning circuit means;
    voltage controlled amplifier means having an input connected to said high pass filter means and having an output and a control input;
    spectral weighting amplifier circuit means connected between the output of said voltage controlled amplifier and the output of said threshold positioning circuit means and including an additional high pass frequency filter means; and
    non-linear frequency filter and peak detector means connected between said output of said positioning circuit means and said control input of said voltage controlled amplifier means for detecting amplitude versus frequency characteristics of said control signal and for varying the gain of said voltage controlled amplifier means in response to said characteristics.

4. The noise reduction system of claim 3, wherein said threshold positioning circuit means further comprises:
    a manually controlled threshold adjustment means connected to said output of said threshold positioning circuit means for adjustably setting a nominal gain level for said control signal at said output relative to the audio signal received at said input.

5. The noise reduction system of claim 2, wherein said plurality of band-pass threshold signal detecting means each comprise:
    a band-pass filter connected to said output of said threshold positioning circuit means; and
    a non-linear peak detector means connected to said band-pass filter for detecting peak voltage excursions of frequency components of said control signal that exceed said predetermined threshold.

6. The noise reduction system of claim 5, wherein said peak detector means comprises:
    a half-wave voltage doubling peak detector and a non-linear transfer circuit connected thereto, said peak detector including a resistive-capacitive storage network having a predetermined response time and said non-linear transfer circuit including a resistive-capacitive storage network having a response time less than that of said predetermined response time such that said peak detector means tracks variations in the frequency components of said control signal without causing intermodulation of the frequency components of said audio signal passed by said plurality of electrically controlled filter means.

7. The noise reduction system of claim 2, wherein said plurality of filter means comprises:
    a cascaded series of voltage controlled notch filters in which the input of a first of said notch filters receives said audio signal and an output of a last of said notch filters issues the audio signal with noise reduction.

8. The noise reduction system as defined in claim 2, wherein said audio signal is composed of frequency components originating from related channels, and said system further comprises:
    an additional plurality of electrically controlled filter means for receiving the portion of said audio signal from one of said channels and said first named plurality of electrically controlled filter means receiving the portion of said audio signal from another of said channels, said additional plurality of filter means being connected in parallel with said first named plurality of filter means to corresponding ones of said plurality of signal detecting means;
summing amplifier means having inputs for receiving both said portions of said audio signal and having an output issuing the summation of said portions, said input of said threshold positioning circuit means connected to said output of said summing amplifier means.

* * * * *